(12) United States Patent
Fukushima

(10) Patent No.: US 10,594,305 B2
(45) Date of Patent: Mar. 17, 2020

(54) OSCILLATOR

(71) Applicant: Rohm Co., Ltd., Kyoto (JP)

(72) Inventor: Shun Fukushima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 77 days.

(21) Appl. No.: 15/912,630

(22) Filed: Mar. 6, 2018

(65) Prior Publication Data
US 2018/0262183 A1 Sep. 13, 2018

(30) Foreign Application Priority Data

Mar. 7, 2017 (JP) .................. 2017-042858
Mar. 7, 2017 (JP) .................. 2017-042860

(51) Int. Cl.
*H03B 5/12* (2006.01)
*H03B 5/24* (2006.01)
*H03K 3/353* (2006.01)
*H03K 19/21* (2006.01)
*H03K 21/08* (2006.01)
*H03K 3/0231* (2006.01)
*H03M 1/66* (2006.01)

(52) U.S. Cl.
CPC ........... *H03K 3/353* (2013.01); *H03K 3/0231* (2013.01); *H03K 19/21* (2013.01); *H03K 21/08* (2013.01); *H03M 1/66* (2013.01)

(58) Field of Classification Search
CPC ...... H03K 3/353; H03K 3/0231; H03K 21/08; H03K 19/21; H03M 1/66
USPC ..................................... 331/108 R
See application file for complete search history.

(56) References Cited

U.S. PATENT DOCUMENTS

| 7,580,443 B2 * | 8/2009 | Uemura | ............... H03C 3/0925 |
| | | | 327/156 |
| 2002/0145478 A1 * | 10/2002 | Chang | ............... H03C 3/095 |
| | | | 331/78 |
| 2016/0099719 A1 | 4/2016 | Iwasaki | |

FOREIGN PATENT DOCUMENTS

JP 2016-076918 5/2016

* cited by examiner

*Primary Examiner* — Richard Tan
(74) *Attorney, Agent, or Firm* — Fish & Richardson P.C.

(57) ABSTRACT

Provided is an oscillator arranged to output an oscillation signal of an oscillation frequency having an increasing and decreasing component that increases and decreases in one period, and an offset component for each period.

14 Claims, 19 Drawing Sheets

Fig.4A

| counter bit4 | bit3 | bit2 | bit1 | bit0 | DAC bit4 | bit3 | bit2 | bit1 | bit0 | decimal |
|---|---|---|---|---|---|---|---|---|---|---|
| 0 | 0 | 0 | 0 | 0 | 0 | 0 | 0 | 0 | 0 | 0 |
| 0 | 0 | 0 | 0 | 1 | 1 | 1 | 0 | 0 | 0 | 8 |
| 0 | 0 | 0 | 1 | 0 | 1 | 0 | 0 | 0 | 0 | 16 |
| 0 | 0 | 0 | 1 | 1 | 1 | 1 | 0 | 0 | 0 | 24 |
| 0 | 0 | 1 | 0 | 0 | 1 | 1 | 1 | 0 | 0 | 28 |
| 0 | 0 | 1 | 0 | 1 | 0 | 1 | 1 | 0 | 0 | 20 |
| 0 | 0 | 1 | 1 | 0 | 0 | 0 | 1 | 0 | 0 | 12 |
| 0 | 0 | 1 | 1 | 1 | 0 | 1 | 0 | 0 | 0 | 4 |
| 0 | 1 | 0 | 0 | 0 | 0 | 0 | 0 | 1 | 0 | 2 |
| 0 | 1 | 0 | 0 | 1 | 1 | 1 | 0 | 1 | 0 | 10 |
| 0 | 1 | 0 | 1 | 0 | 1 | 0 | 0 | 1 | 0 | 18 |
| 0 | 1 | 0 | 1 | 1 | 1 | 1 | 0 | 1 | 0 | 26 |
| 0 | 1 | 1 | 0 | 0 | 1 | 1 | 1 | 1 | 0 | 30 |
| 0 | 1 | 1 | 0 | 1 | 0 | 1 | 1 | 1 | 0 | 22 |
| 0 | 1 | 1 | 1 | 0 | 0 | 0 | 1 | 1 | 0 | 14 |
| 0 | 1 | 1 | 1 | 1 | 0 | 1 | 0 | 1 | 0 | 6 |

Fig. 4B

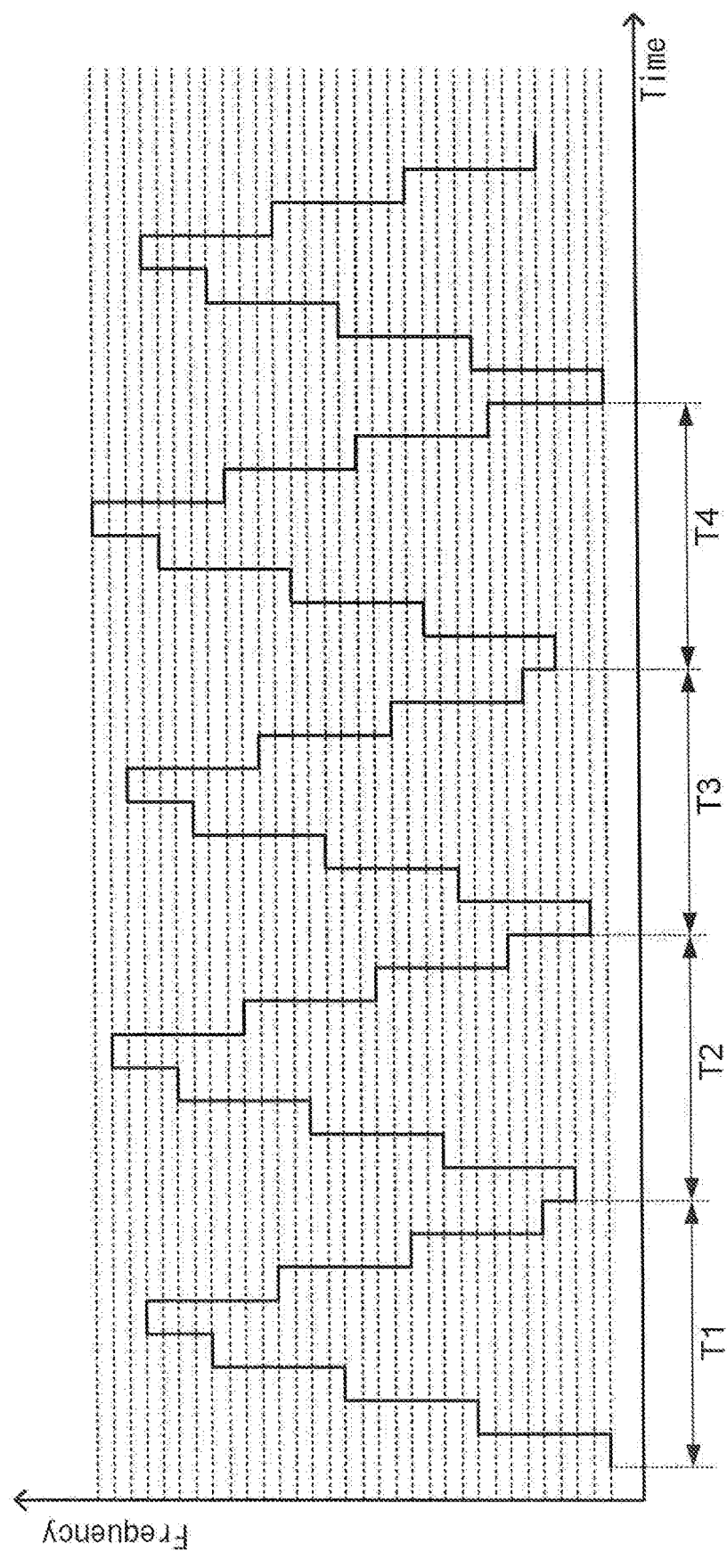

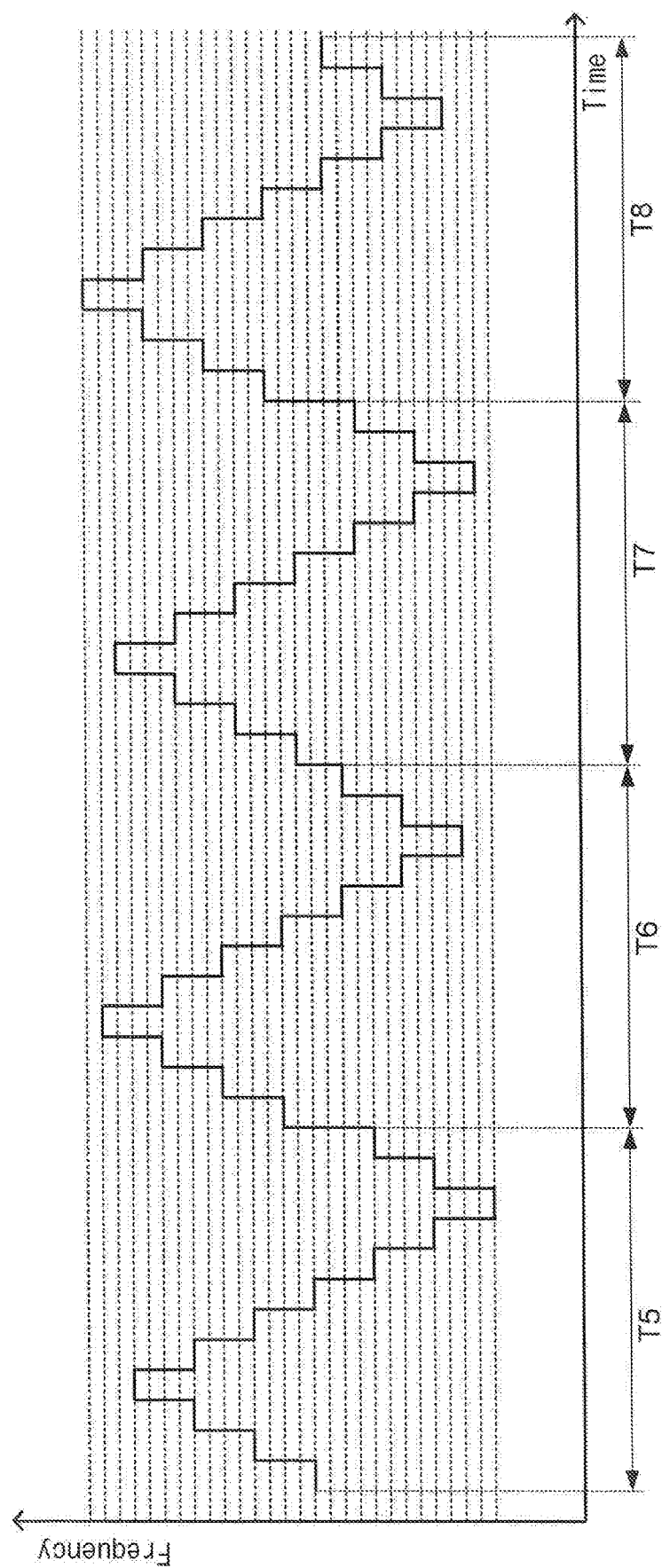

US 10,594,305 B2

OSCILLATOR

CROSS-REFERENCE TO RELATED APPLICATIONS

This nonprovisional application claims priority under 35 U.S.C. § 119(a) on Patent Applications No. 2017-42858 and 2017-42860 both filed in Japan on Mar. 7, 2017, the entire contents of which are hereby incorporated by reference.

BACKGROUND OF THE INVENTION

Field of the Invention

The present invention relates to an oscillator having a frequency spreading function.

Description of Related Art

Conventionally, a DC-DC converter has a problem that when its switching frequency is fixed, switching noise is concentrated at the frequency and harmonics thereof. Therefore, a conventional DC-DC converter includes an oscillator having a frequency spreading (spectrum spreading) function.

A structural example of the oscillator having the frequency spreading function is shown in FIG. 1. An oscillator 10 shown in FIG. 1 includes an oscillation circuit 101, a counter 2, a logic circuit 3, and a D/A converter (DAC) 4. The oscillation circuit 101 includes a one-shot circuit 1, an error amplifier 5, a current mirror circuit CM, a transistor Q1, a resistor R1, a capacitor C1, a comparator CP1, and a transistor M1. The oscillation circuit 101 generates and outputs a clock signal CLK (oscillation signal).

The current mirror circuit CM is constituted of a transistor Tr1 and a transistor Tr2. Each of the transistors Tr1 and Tr2 is constituted of a p-channel MOSFET. The gates of the transistors Tr1 and Tr2 are connected to the drain of the transistor Tr1. The sources of the transistors Tr1 and Tr2 are connected to an application terminal of a power supply voltage Vdd.

The drain of the transistor Tr2 is connected to one terminal of the capacitor C1, and the other terminal of the capacitor C1 is connected to an application terminal of a ground potential. A connection node between the drain of the transistor Tr2 and the one terminal of the capacitor C1 is connected to the drain of the transistor M1 constituted of an n-channel MOSFET. The source of the transistor M1 is connected to the application terminal of the ground potential.

In addition, the connection node between the drain of the transistor Tr2 and the one terminal of the capacitor C1 is also connected to a noninverting input terminal (+) of the comparator CP1. An inverting input terminal (−) of the comparator CP1 is connected to an application terminal of a reference voltage VREF.

An output of the comparator CP1 is input to the one-shot circuit 1. The one-shot circuit 1 is a circuit that outputs a one-shot pulse having high level for a certain period at timing when the output of the comparator CP1 rises to high level. The one-shot circuit 1 outputs the clock signal CLK as the one-shot pulse.

The clock signal CLK is input to the gate of the transistor M1 and is also input to the counter 2. A digital output of the counter 2 is input to a DAC 4 via the logic circuit 3. The DAC 4 converts an input digital signal into a reference voltage RTREF as an analog signal and outputs it to a noninverting input terminal (+) of the error amplifier 5.

An output of the error amplifier 5 is input to the gate of the transistor Q1 constituted of an n-channel MOSFET. The drain of the transistor Q1 is connected to the drain of the transistor Tr1. The source of the transistor Q1 is connected to an inverting input terminal (−) of the error amplifier 5 together with one terminal of the resistor R1. The other terminal of the resistor R1 is connected to the application terminal of the ground potential.

An operation of the oscillator 10 having the structure described above is described as follows. The circuit constituted of the error amplifier 5 and the transistor Q1 limits a voltage RT generated at the source of the transistor Q1 to be equal to the reference voltage RTREF. The voltage RT and the resistor R1 generate current I1. In other words, the current I1 is proportional to the reference voltage RTREF.

When the current I1 is mirrored by a current mirror circuit CM1, current I2 is generated. The current I2 flows to the capacitor C1. The capacitor C1 that has been discharged is charged by the current I2. In this case, a voltage of the capacitor C1 rises at a speed in proportion to the current I2.

When the voltage of the capacitor C1 rises and reaches the reference voltage VREF, the output of the comparator CP1 rises to high level, and the one-shot circuit 1 outputs the clock signal CLK having high level for a certain period. The clock signal CLK turns on the transistor M1, and the capacitor C1 is discharged. In this way, a frequency of the clock signal CLK (oscillation frequency) is proportional to the reference voltage RTREF.

The counter 2 proceeds counting by trigger of rising of the clock signal CLK to high level. The counter 2 outputs its count value (digital signal) as a result of the counting so that the DAC 4 receives the count value via the logic circuit 3, and the input to the DAC 4 (digital signal) changes. The DAC 4 performs D/A conversion of the changed input signal so that the changed reference voltage RTREF is output to the error amplifier 5. In this way, the frequency of the clock signal CLK is changed.

By repeating this operation, the oscillator 10 can change the frequency of the clock signal CLK in each period.

In this description, one structural example of the counter 2, the logic circuit 3, and the DAC 4 of the oscillator 10 is shown in FIG. 12. In FIG. 12, a counter 201 corresponds to the counter 2, a DAC 401 corresponds to the DAC 4, and XOR circuits 301A to 301D constitute the logic circuit 3.

The counter 201 outputs its count value having five bits including bit0 to bit4. In addition, the DAC 401 receives a digital signal of five bits including bit0 to bit4. The counter 201 outputs the most significant bit, i.e. bit4, which is directly received as the least significant bit, i.e. bit0 by the DAC 401 and is supplied to one of input terminals of each of the XOR circuits 301A to 301D. The counter 201 outputs other bits, i.e. bit0 to bit3 to the other input terminals of the XOR circuits 301A to 301D, respectively. Output of the XOR circuits 301A to 301D are respectively supplied to bit4 to bit1 of the DAC 401.

The counter 201 counts the count value from "00000" to "11111". In this case, the upper four bits, i.e. bit4 to bit1 of the input to the DAC 401 are counted up from "0000" to "1111" and then are counted down from "1111" to "0000". In addition, the least significant bit, i.e. bit0 of the input to the DAC 401 is "0" during the count up of the upper four bits in the input to the DAC 401, and the bit0 is "1" during the countdown of the upper four bits. In other words, when expressing the input to the DAC in decimal number, it increases from 0 to 30 by 2 and then decreases from 31 to 1 by 2.

The DAC 401 performs D/A conversion of the digital input constituted of bit0 to bit4 so as to output the reference voltage RTREF, and the frequency of the clock signal CLK is proportional to the reference voltage RTREF. Therefore, temporal transition of the frequency of the clock signal CLK corresponding to count by the counter 201 is as shown in FIG. 14. As shown in FIG. 14, in one period T10 of frequency spreading, the frequency of the clock signal CLK gradually increases in each period of the clock signal CLK and then gradually decreases in each period.

In one period T10, the frequency of the clock signal CLK is spread into 32 frequencies, and hence a peak of noise can be reduced by sufficiently spreading the frequency. However, there is a problem that one period T10 of the frequency spreading is elongated and low frequency noise in the audible band is generated. Note that the generation of noise in the audible band when the frequency is spread into 32 frequencies is an example, and such noise is not always generated.

Therefore, for example, the counter 2, the logic circuit 3, and the DAC 4 of the oscillator 10 may be constituted as shown in FIG. 13. In FIG. 13, a counter 202 corresponds to the counter 2, a DAC 402 corresponds to the DAC 4, and XOR circuits 302A and 302B constitute the logic circuit 3.

The structure shown in FIG. 13 is basically the same as in FIG. 12, but both the output of the counter 202 and the inputs of the DAC 402 have three bits. The counter 202 counts from "000" to "111". In this case, upper two bits in the input to the DAC 402 are counted up from "00" to "11" and then are counted down from "11" to "00". The least significant bit of the input to the DAC 402 becomes "0" during the count up period, while it becomes "1" during the countdown period. Therefore, when expressing the digital input to the DAC 402 in decimal number, it increases from 0 to 6 by two and decreases from 7 to 1 by two.

Temporal transition of the frequency of the clock signal CLK in the oscillator 10 using this structure shown in FIG. 13 is as shown in FIG. 15. As shown in FIG. 15, in one period T11 of frequency spreading, increase and decrease of frequency is performed, and the frequency is spread into eight frequencies. Because one period T11 of the frequency spreading is shortened, generation of low frequency noise in the audible band can be reduced compared with the case shown in FIG. 14 described above. However, the frequency is spread into eight frequencies but is not sufficiently spread, and hence there is a problem that a peak of noise is increased. In other words, the effect of the frequency spreading is reduced.

In addition, another structural example of the oscillator having a frequency spreading function different from that shown in FIG. 1 is shown in FIG. 8. An oscillator 10A shown in FIG. 8 includes an oscillation circuit 101 and a reference voltage generation portion 102. The reference voltage RTREF generated by the reference voltage generation portion 102 is input to the noninverting input terminal (+) of an error amplifier EA.

The reference voltage generation portion 102 generates the reference voltage RTREF that varies along time. In this way, the frequency of the clock signal CLK is changed, and frequency spreading is realized.

The reference voltage generation portion 102 can be constituted of an analog circuit using a constant current circuit, a capacitor, and the like, for example. In this case, it is supposed that the reference voltage generation portion 102 generates a reference voltage RTREF of a triangular wave that continuously varies, for example. In this case, one example of the temporal transition of the frequency of the clock signal CLK output from the oscillation circuit 101 is shown in FIG. 16. Marks "○" shown in FIG. 16 indicate frequencies of the clock signal CLK (the same is true for marks "○" in other figures described below).

FIG. 16 shows a case where the frequency of the clock signal CLK (oscillation frequency) is synchronized with a frequency spreading period T. On the other hand, FIG. 17 shows another example of the temporal transition of the frequency of the clock signal CLK output from the oscillation circuit 101. FIG. 17 shows a case where the frequency of the clock signal CLK is not synchronized with the frequency spreading period T. In the structure of the oscillator 10A of FIG. 8, unlike the oscillator 10 of FIG. 1, the reference voltage generation portion 102 does not receive the clock signal CLK output from the one-shot circuit 1, and hence the frequency of the clock signal CLK may not be synchronized with the frequency spreading period T as shown in FIG. 17.

Broken lines in FIGS. 16 and 17 indicate frequency levels that the clock signal CLK can have. The number of broken lines is larger in the asynchronized case shown in FIG. 17 than in the synchronized case shown in FIG. 16. In other words, because the number of frequency levels that the clock signal CLK can have is larger, frequency spreading can be sufficiently performed. Depending on conditions, contingent synchronization may occur, and in this case frequency spreading is not sufficiently performed as shown in FIG. 16. For example, despite that there is no problem when the product is shipped, there may be a case in which the synchronization has occurred in the market, which causes a problem.

Therefore, it is considered to configure the oscillator 10A as shown in FIG. 9, for example. In the oscillator 10A shown in FIG. 9, the reference voltage generation portion 102 includes an oscillation portion 1021, the counter 2, the logic circuit 3, and the DAC (D/A converter) 4.

The oscillation portion 1021 generates an oscillation signal OS as a pulse signal having a predetermined period and outputs it to the counter 2. The counter 2 counts the oscillation signal OS. The digital output of the counter 2 is input to the DAC 4 via the logic circuit 3. The DAC 4 converts the digital input into the reference voltage RTREF as an analog signal and outputs the reference voltage RTREF.

In this description, one structural example of the counter 2, the logic circuit 3, and the DAC 4 in the reference voltage generation portion 102 can have the structure shown in FIG. 12 described above. The DAC 401 performs D/A conversion of the digital input constituted of bit0 to bit4 so as to output the reference voltage RTREF, and the frequency of the clock signal CLK is proportional to the reference voltage RTREF. Therefore, temporal transition of the frequency of the clock signal CLK corresponding to count by the counter 201 is as shown in FIG. 18.

FIG. 18 shows a case where the frequency of the clock signal CLK is synchronized with the frequency spreading period T10. Even in this synchronized case, the frequency of the clock signal CLK is spread into 32 frequencies, and hence a peak of noise can be reduced by sufficiently spreading the frequency. In the asynchronized case, the frequency of the clock signal CLK is spread into more number of frequencies, and hence the effect of frequency spreading is increased. However, there is a problem that the frequency spreading period T10 is elongated and low frequency noise in the audible band is generated. Note that the generation of noise in the audible band when the frequency is spread into 32 frequencies is one example, and such noise is not always generated.

Therefore, for example, the counter 2, the logic circuit 3, and the DAC 4 in the reference voltage generation portion 102 can have the structure as shown in FIG. 13 described above. The temporal transition of the frequency of the clock signal CLK in the oscillator 10A in the case where the structure shown in FIG. 13 is used is as shown in FIG. 19. FIG. 19 shows the case where the frequency of the clock signal CLK is synchronized with the frequency spreading period T11.

As shown in FIG. 19, in one period T11 of frequency spreading, increase and decrease of frequency is performed, and the frequency is spread into eight frequencies. Because one period T11 of frequency spreading is shortened, it is possible to reduce generation of low frequency noise in the audible band compared with the case shown in FIG. 18 described above. However, in the case where the frequency of the clock signal CLK is synchronized with the frequency spreading period T11, the frequency is spread into eight frequencies and is not sufficiently spread, and hence there is a problem that a peak of noise is increased. In other words, the effect of frequency spreading is decreased.

Note that one example of the conventional technique related to the above description is disclosed in JP-A-2016-76918.

SUMMARY OF THE INVENTION

An oscillator according to one aspect of the present invention outputs an oscillation signal of an oscillation frequency having an increasing and decreasing component that increases and decreases in one period and an offset component for each period.

BRIEF DESCRIPTION OF THE DRAWINGS

FIGS. 4A and 4B (collectively FIG. 4) are tables showing transitions of output bits in the counter and input bits in the DAC according to the first or the third embodiment of the present invention.

FIG. 6 is a diagram showing a temporal transition of a clock signal frequency according to the first embodiment of the present invention.

FIG. 7 is a diagram showing a temporal transition of a clock signal frequency according to the second embodiment of the present invention.

DETAILED DESCRIPTION OF THE PREFERRED EMBODIMENTS

Hereinafter, one embodiment of the present invention is described with reference to the drawings.

First Embodiment

Figure 1:
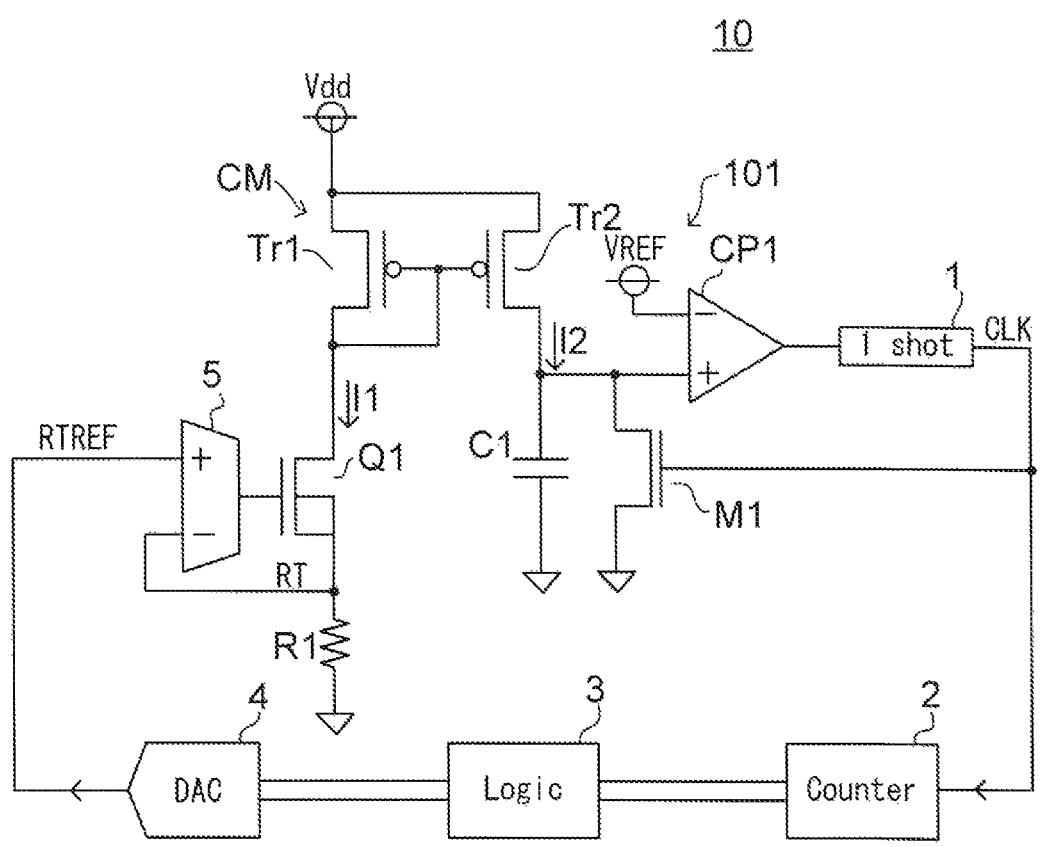
FIG. 1 is a diagram showing a structure of an oscillator according to a first or second embodiment of the present invention.

A structure of an oscillator according to a first embodiment of the present invention is basically the same as the structure of the oscillator 10 shown in FIG. 1 described above. The structure of the oscillator 10 itself is described above, and hence detailed description is omitted in this description. An embodiment about a structure of the counter 2, the logic circuit 3, and the DAC 4 in the oscillator 10 is described below.

Figure 2:
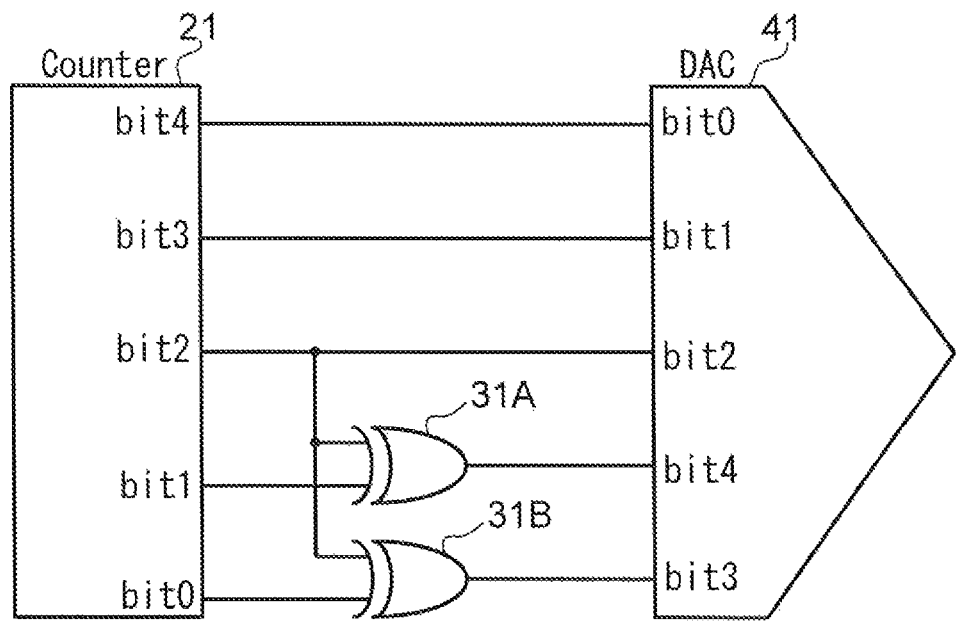
FIG. 2 is a diagram showing a structure using a counter and a DAC according to the first or a third embodiment of the present invention.

A specific structure of the counter 2, the logic circuit 3, and the DAC 4 according to the first embodiment of the present invention is shown in FIG. 2. In FIG. 2, a counter 21 corresponds to the counter 2, a DAC 41 corresponds to the DAC 4, and XOR circuits 31A and 31B constitute the logic circuit 3.

The counter 21 outputs a count value of five bits including bit0 to bit4. In addition, the DAC 41 receives a digital signal of five bits including bit0 to bit4. The lower three bits (bit0 to bit2) in the output of the counter 21 are connected to the upper three bits (bit2 to bit4) in the input of the DAC 41. The most significant bit, i.e. bit2 out of the lower three bits in the output of the counter 21 is directly connected to the least significant bit, i.e. bit2 out of the upper three bits in the input of the DAC 41. In addition, the bit2 in the output of the counter 21 is also connected to one of input terminals of each of the XOR circuits 31A and 31B.

The bit1 out of the lower three bits in the output of the counter 21 is connected to the other input terminal of the XOR circuit 31A. The bit0 out of the lower three bits in the output of the counter 21 is connected to the other input terminal of the XOR circuit 31B. The output of the XOR circuit 31A is connected to the bit4 in the input of the DAC 41. The output of the XOR circuit 31B is connected to the bit3 in the input of the DAC 41. In other words, the bits other than the most significant bit out of the lower three bits (bit1 and bit0) in the output of the counter 21 are connected to the bits other than the least significant bit out of the upper three bits (bit4 and bit3) in the input of the DAC 41 via the XOR circuits 31A and 31B.

In other words, the most significant bit (bit1) out of the bits other than the most significant bit out of the lower three bits in the output of the counter 21 is connected to the most significant bit (bit4) out of the bits other than the least significant bit out of the upper three bits in the input of the DAC 41 via the XOR circuit 31A. The bit (bit0) shifted by one bit from the most significant bit out of the bits other than the most significant bit out of the lower three bits in the output of the counter 21 is connected to the bit (bit3) shifted by one bit from the most significant bit out of the bits other than the least significant bit out of the upper three bits in the input of the DAC 41 via the XOR circuit 31B.

In addition, the bit4 out of the upper two bits in the output of the counter 21 is connected to bit0 out of the lower two bits in the input of the DAC 41, and the bit3 in the output of the counter 21 is connected to the bit1 in the input of the DAC 41. In other words, the upper two bits (bit4 and bit3) in the output of the counter 21 are connected to the lower two bits (bit1 and bit0) in the input of the DAC 41 by reversing the upper and lower relationship. In other words, 2 (=5−3) bits other than the lower three bits in the output of the counter 21 are connected to 2 (=5−3) bits other than the upper three bits in the input of the DAC 41.

Figure 4B:
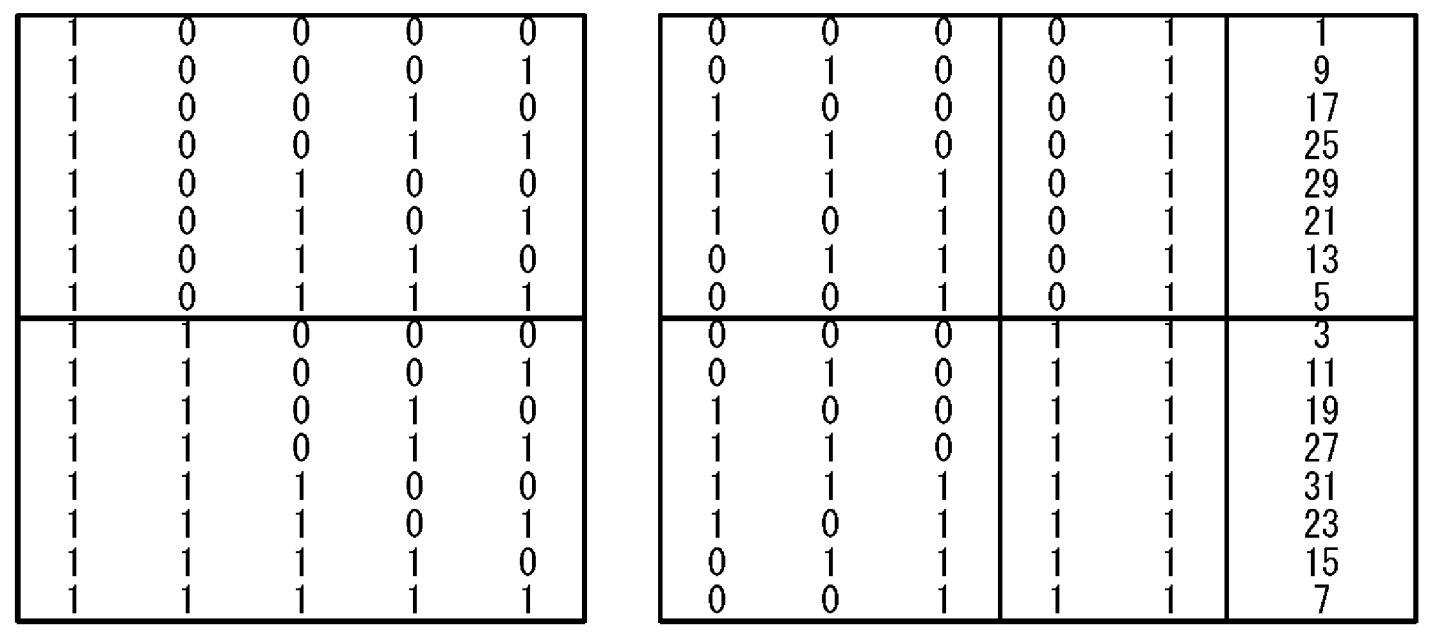

In this structure shown in FIG. 2, transitions of output bits in the counter 21 and input bits in the DAC 41 in a case where the counter 21 counts are shown in FIG. 4. Note that in the table shown in FIG. 4, the rightmost field shows values expressed in decimal number of the input of the DAC 41.

The counter 21 counts from "00000" to "11111". During the count from "00000" to "00111" (referred to as a first count), the upper three bits in the input bits of the DAC 41 increases from "000" to "111" and then decreases to "001". The increase and decrease similar to the input bits of the DAC 41 is also performed during the count by the counter 21 from "01000" to "01111" (referred to as a second count), from "10000" to "10111" (referred to as a third count), and from "11000" to "11111" (referred to as a fourth count). In other words, the upper three bits in the input of the DAC 41 correspond to the bits indicating an increasing and decreasing component (first bits).

In this case, the lower two bits in the input of the DAC 41 become "00" in the first count, "10" in the second count, "01" in the third count, and "11" in the fourth count. In other words, the lower two bits in the input of the DAC 41 correspond to the bits indicating an offset component (second bits).

In this way, in the first count, the value expressed in decimal number of the input of the DAC 41 increases from 0 to 24 by 8 step and then decreases from 28 to 4 by 8 step. In the second count, the value expressed in decimal number increases from 2 to 26 by 8 step and then decreases from 30 to 6 by 8 step. The lower two bits "10" in the input of the DAC 41 in the second count has a "+2" offset in decimal number with reference to the lower two bits "00" in the input of the DAC 41 in the first count. Therefore, in the second count, with reference to the first count, the value in decimal number of the input of the DAC 41 maintains the same increase and decrease and has a "+2" offset.

In the same manner, in the third count, the lower two bits in the input of the DAC 41 become "01", and hence with reference to the first count, the value in decimal number of the input of the DAC 41 has a "+1" offset. In this way, in the third count, the value expressed in decimal number of the input of the DAC 41 increases from 1 to 25 by 8 step and then decreases from 29 to 5 by 8 step.

In the same manner, in the fourth count, the lower two bits in the input of the DAC 41 become "11", and hence with reference to the first count, the value in decimal number of the input of the DAC 41 has a "+3" offset. In this way, in the fourth count, the value expressed in decimal number of the input of the DAC 41 increases from 3 to 27 by 8 step and then decreases from 31 to 7 by 8 step.

The DAC 41 performs D/A conversion of the digital input constituted of bit0 to bit4 so as to output the reference voltage RTREF, and the frequency of the clock signal CLK is proportional to the reference voltage RTREF. Therefore, temporal transition of the frequency of the clock signal CLK corresponding to count by the counter 21 is as shown in FIG. 6.

In FIG. 6, each of the periods T1 to T4 is a period corresponding to each of the first to fourth counts. In this way, in the periods T2 to T4, with reference to one period T1, the frequency of the clock signal CLK maintains the same increase and decrease while having different offsets. In other words, the frequency (oscillation frequency) of the clock signal CLK (oscillation signal) has the increasing and decreasing component that increases and decreases in one period and the offset component for each period.

In FIG. 6, noises having frequencies corresponding to ⅛, 1/16, and 1/32 of one clock frequency of the clock signal CLK are generated, and a noise having ⅛ frequency among them becomes dominant. Therefore, it is possible to reduce generation of low frequency noise in the audible band.

In addition, broken lines shown in FIG. 6 indicate frequency levels generated in each of the periods T1 to T4. In this way, in this embodiment, in the period constituted of each of the periods T1 to T4, the frequency is spread into 32 frequencies. Therefore, sufficient frequency spreading can reduce a noise peak.

In this way, in this embodiment, the effect of frequency spreading can be improved while reducing low frequency noise in the audible band.

Second Embodiment

Figure 3:
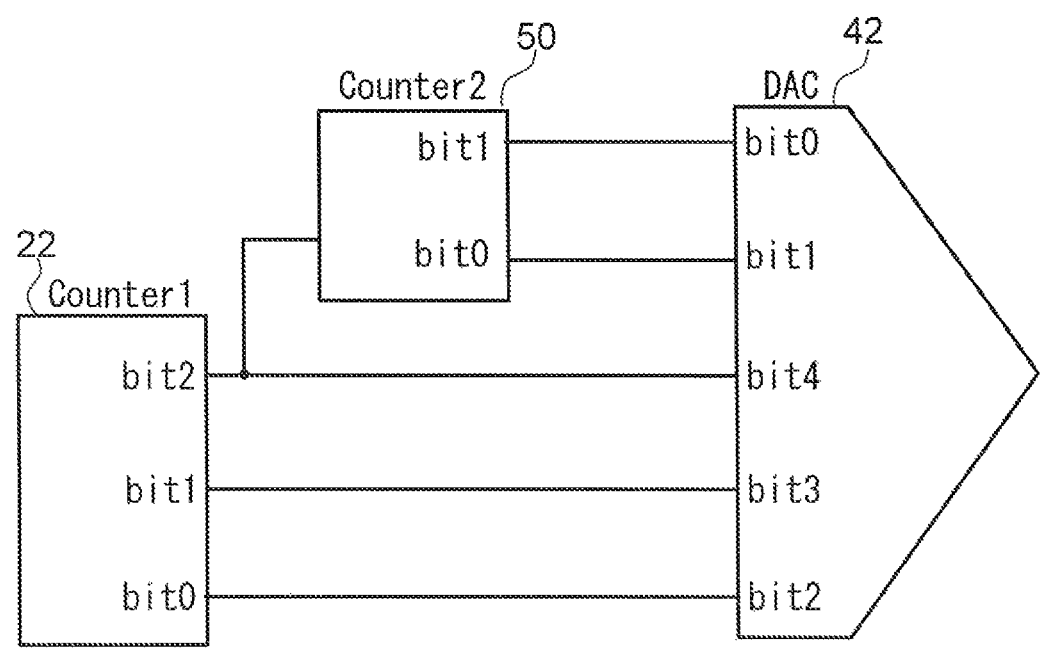
FIG. 3 is a diagram showing a structure using a counter and a DAC according to the second or a fourth embodiment of the present invention.

Next, a second embodiment as a variation of the first embodiment is described. A specific structure of the counter 2 and the DAC 4 according to the second embodiment is shown in FIG. 3. In FIG. 3, a first counter 22 corresponds to the counter 2, and a DAC 42 corresponds to the DAC 4. Note that in this embodiment, the logic circuit 3 is not constituted. In addition, a second counter 50 different from the first counter 22 is disposed between the first counter 22 and the DAC 42.

The counter 22 outputs a count value having three bits, i.e. bit0 to bit2. In addition, the DAC 42 is supplied with a digital signal having five bits, i.e. bit0 to bit4. The second counter 50 outputs a count value having two bits obtained by subtracting the number of output bits of the first counter 22 from the number of input bits of the DAC 42.

The three bits (bit0 to bit2) in the output of the first counter 22 are directly connected to the upper three bits (bit2 to bit4) in the input of the DAC 42. The second counter 50 counts rising edges of the most significant bit (bit2) in the output of the first counter 22. The second counter 50 outputs a count value having two bits (bit0 and bit1). The output bits of the second counter 50 are connected to the lower two bits (bit0 and bit1) in the input of the DAC 42 by reversing the upper and lower relationship.

Figure 5A:
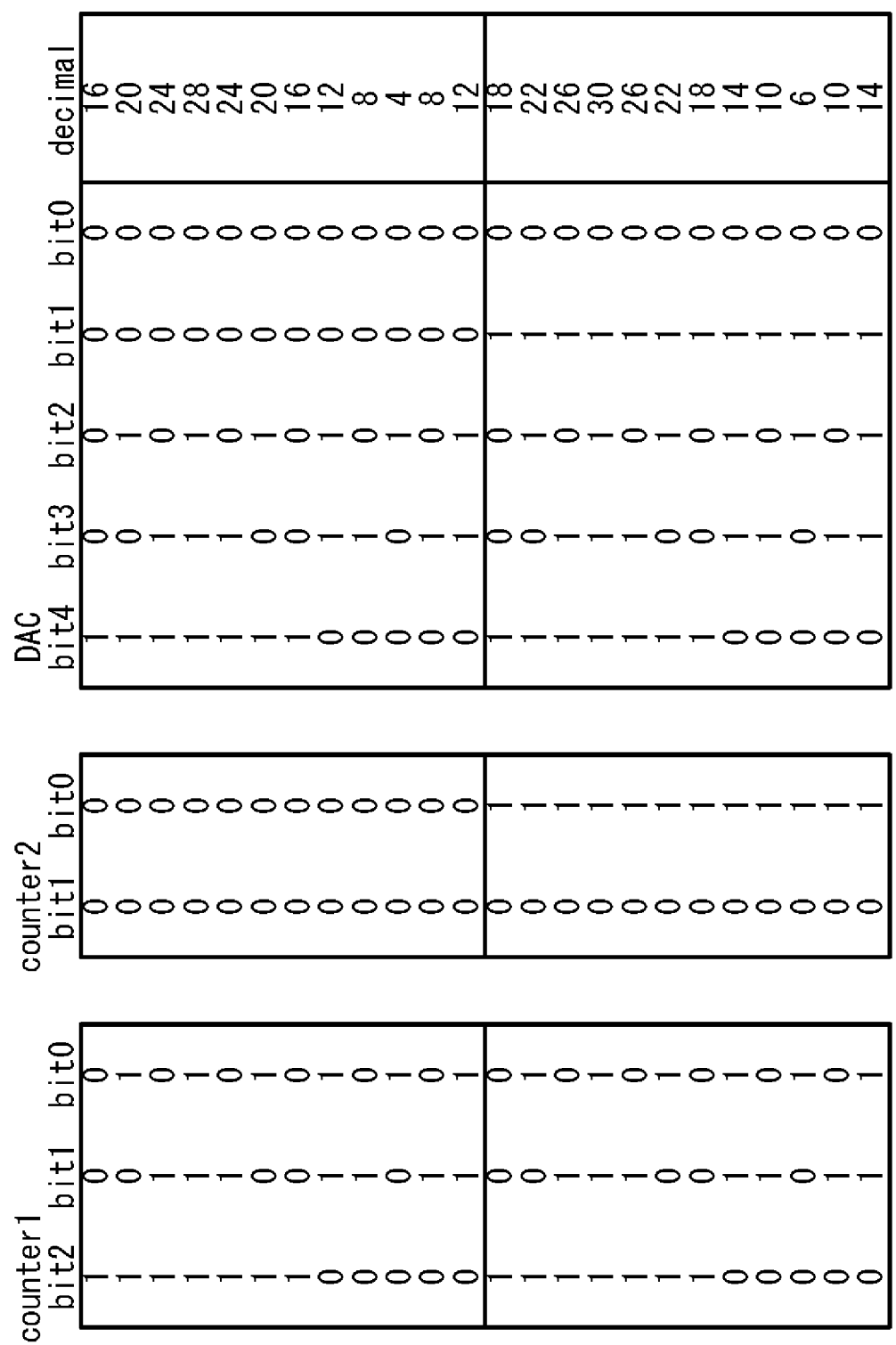
FIGS. 5A and 5B (collectively FIG. 5) are tables showing transitions of output bits in the counter and input bits in the DAC according to the second or fourth embodiment of the present invention.
Figure 5B:
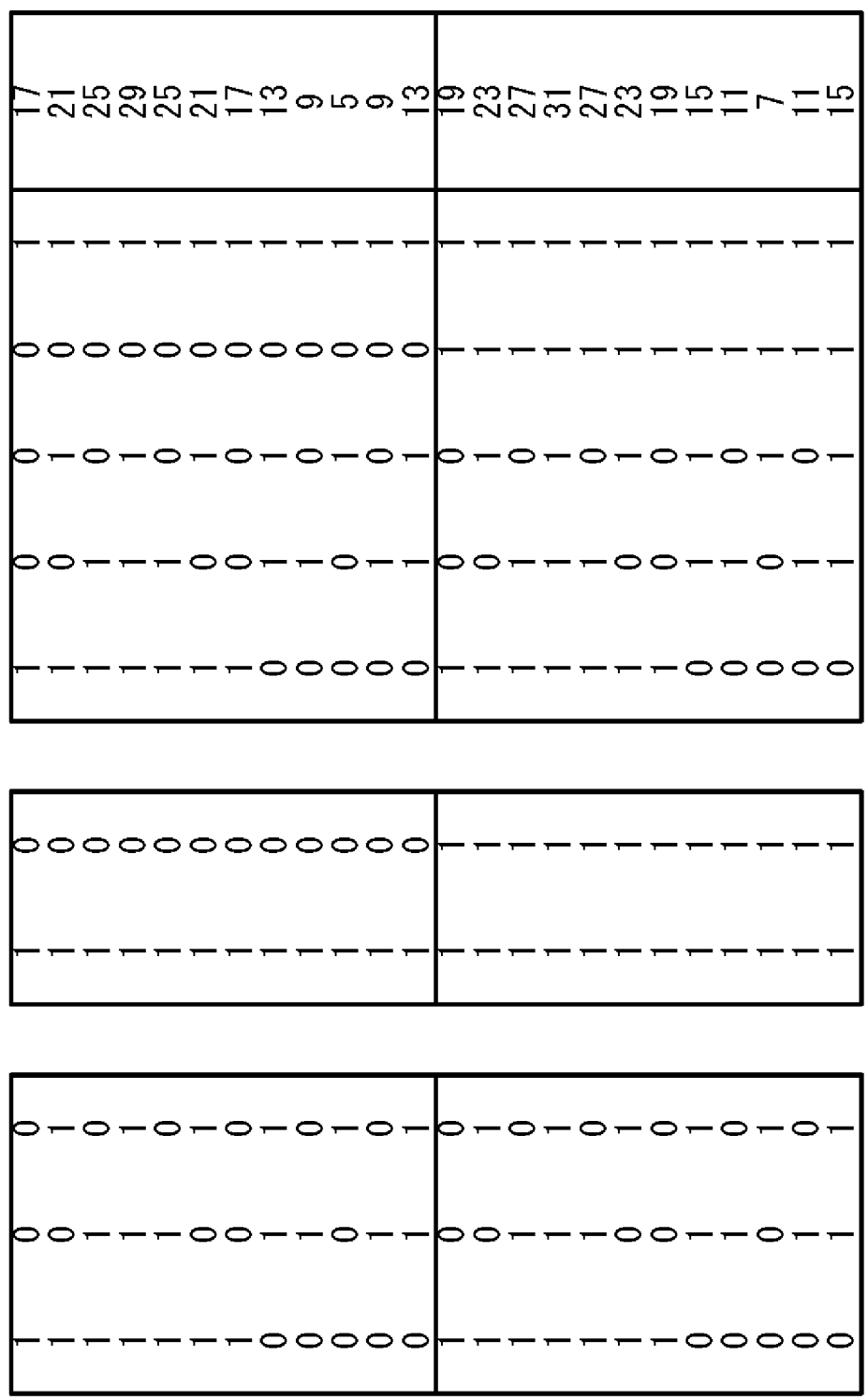

In this structure shown in FIG. 3, transitions of output bits in the first counter 22 and the second counter 50 and input bits in the DAC 42 in a case where the first counter 22 counts are shown in FIG. 5. Note that in the table shown in FIG. 5, the rightmost field shows values expressed in decimal number of the input of the DAC 42.

The first counter 22 counts up from "100" to "111" and then counts down to "001", and afterward counts up to "011" (hereinafter referred to as the first count). After that, the first counter 22 counts up again from "100" to "111" and then counts down to "001", and afterward counts up to "011" (hereinafter referred to as the second count). After that, the first counter 22 counts up again from "100" to "111" and then counts down to "001", and afterward counts up to "011" (hereinafter referred to as the third count). After that, the first counter 22 counts up again from "100" to "111" and then counts down to "001", and afterward counts up to "011" (hereinafter referred to as the fourth count).

The output of the second counter 50 starts from "00", and when the output of the first counter 22 is switched from "011" to "100", i.e., at the same time when switching from the first count to the second count, the second counter 50 counts rising edges of the bit2 so as to output "01". Further, at the same time when switching from the second count to the third count, the second counter 50 counts rising edges of the bit2 so as to output "10". Further, at the same time when switching from the third count to the fourth count, the second counter 50 counts rising edges of the bit2 so as to output "11". Further, at the same time when switching from the fourth count to 0-th count, the second counter 50 counts rising edges of the bit2 so as to output "00".

During the first count, the upper three bits in the input of the DAC 42 increase and decrease in the same manner as the output of the first counter 22. In this case, the lower two bits in the input of the DAC 42 have a value "00" in turn. In addition, during the second count, the upper three bits in the input of the DAC 42 increase and decrease in the same manner as the output of the first counter 22. This increase and decrease is the same as the increase and decrease during the first count. In this case, the lower two bits in the input of the DAC 42 have a value "10" in turn. In addition, during the third count, the upper three bits in the input of the DAC 42 increase and decrease in the same manner as the output of the first counter 22. This increase and decrease is the same as the increase and decrease during the first count. In this case, the lower two bits in the input of the DAC 42 have a value "01" in turn. In addition, during the fourth count, the upper three bits in the input of the DAC 42 increase and decrease in the same manner as the output of the first counter 22. This increase and decrease is the same as the increase and decrease during the first count. In this case, the lower two bits in the input of the DAC 42 have a value "11" in turn. In other words, the upper three bits in the input of the DAC 42 correspond to bits indicating the increasing and decreasing component (first bits), and bits other than the upper three bits in the input of the DAC 42 correspond to bits indicating the offset component (second bits).

The lower two bits "10" in the input of the DAC 42 in the second count has a "+2" offset in decimal number with reference to the lower two bits "00" in the input of the DAC 42 in the first count. The lower two bits "01" in the input of the DAC 42 in the third count has a "+1" offset in decimal number with reference to the lower two bits "00" in the input of the DAC 42 in the first count. The lower two bits "11" in the input of the DAC 42 in the fourth count has a "+3" offset in decimal number with reference to the lower two bits "00" in the input of the DAC 42 in the first count.

In this way, a value in decimal number of the input of the DAC 42 corresponds to increasing from "16" to "28" by "4" step, decreasing to "4" by "4" step, and increasing to "12" by "4" step during the first count, and corresponds to increasing from "18" to "30" by "4" step, decreasing to "6" by "4" step, and increasing to "14" by "4" step during the second count, having a "+2" offset with reference to the first count.

Further, during the third count, the value in decimal number of the input of the DAC 42 corresponds to increasing from "17" to "29" by "4" step, decreasing to "5" by "4" step, and increasing to "13" by "4" step, having a "+1" offset with reference to the first count.

Further, during the fourth count, the value in decimal number of the input of the DAC 42 corresponds to increasing from "19" to "31" by "4" step, decreasing to "7" by "4" step, and increasing to "15" by "4" step, having a "+3" offset with reference to the first count.

Temporal transition of the frequency of the clock signal CLK corresponding to count by the counter 22 is as shown in FIG. 7.

In FIG. 7, each of periods T5 to T8 is a period corresponding to each of the first to fourth counts. In this way, in each of periods T6 to T8, with reference to one period T5, the frequency of the clock signal CLK has an offset while maintaining the same increase and decrease. In other words, the frequency (oscillation frequency) of the clock signal CLK (oscillation signal) has the increasing and decreasing component that increases and decreases in one period and the offset component for each period.

In FIG. 7, noise having a frequency corresponding to 1/12 of the one clock frequency of the clock signal CLK becomes dominant, and hence it is possible to reduce generation of low frequency noise in the audible band.

In addition, broken lines shown in FIG. 7 show frequency levels generated in each of periods T5 to T8. In this way, in this embodiment, in the period constituted of each of periods T5 to T8, the frequency is spread into 28 frequencies. Therefore, sufficient frequency spreading can reduce a noise peak.

In this way, also in this embodiment, the effect of frequency spreading can be improved while reducing low frequency noise in the audible band.

Third Embodiment

Figure 8:
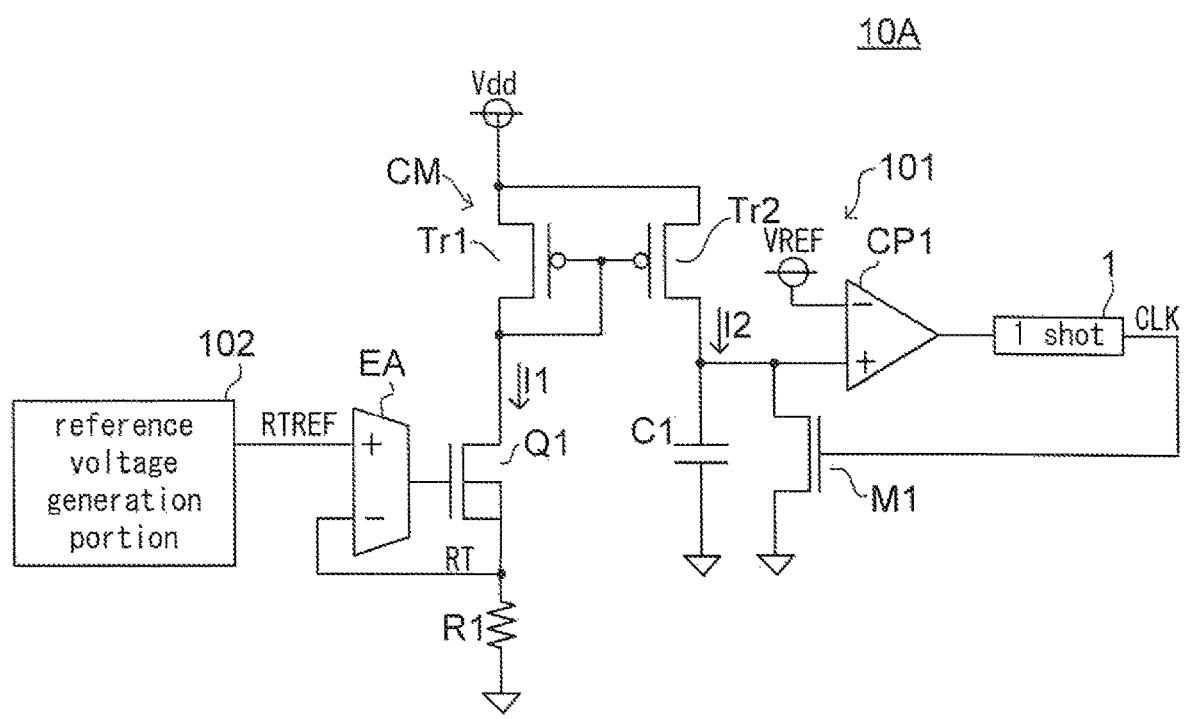
FIG. 8 is a diagram showing a structure of an oscillator according to the third or fourth embodiment of the present invention.
Figure 9:
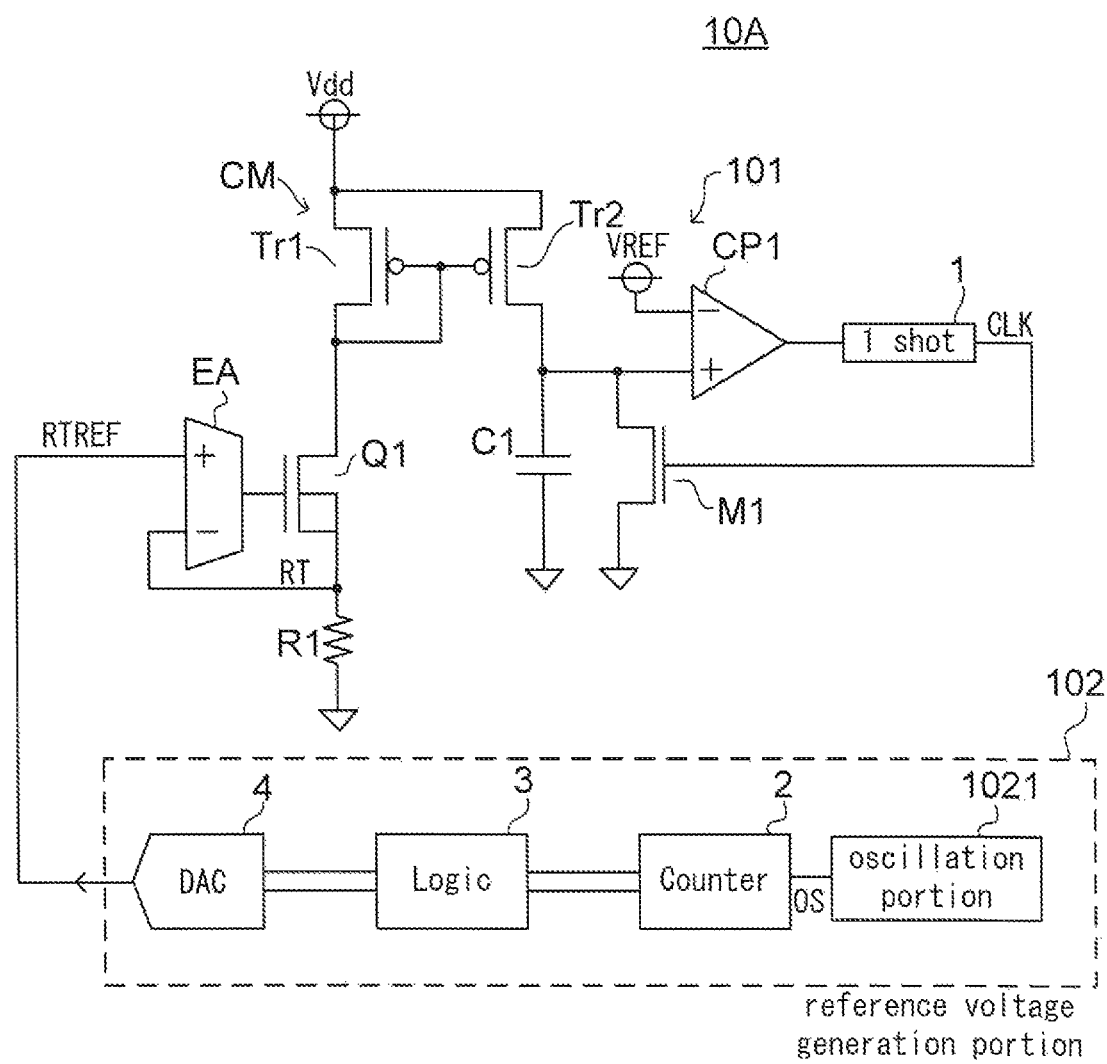
FIG. 9 is a diagram showing a structure of a reference voltage generation portion in the oscillator according to the third or fourth embodiment the present invention.

Next, a third embodiment of the present invention is described. A structure of an oscillator according to the third embodiment of the present invention is basically the same as the structure of the oscillator 10A shown in FIG. 8 described above. The structure of the oscillator 10A itself is described above, and hence detailed description thereof is omitted. The embodiment about the structure of the counter 2, the logic circuit 3, and the DAC 4 (FIG. 9) in the reference voltage generation portion 102 included in the oscillator 10A is described below.

A specific structure of the counter 2, the logic circuit 3, and the DAC 4 according to this embodiment is the structure of FIG. 2 described above, and detailed description of this structure is omitted because it is described above. In this structure shown in FIG. 2, transitions of the output bits in the counter 21 and the input bits in the DAC 41 in the case where the counter 21 counts are shown in FIG. 4 as described above.

Figure 10:
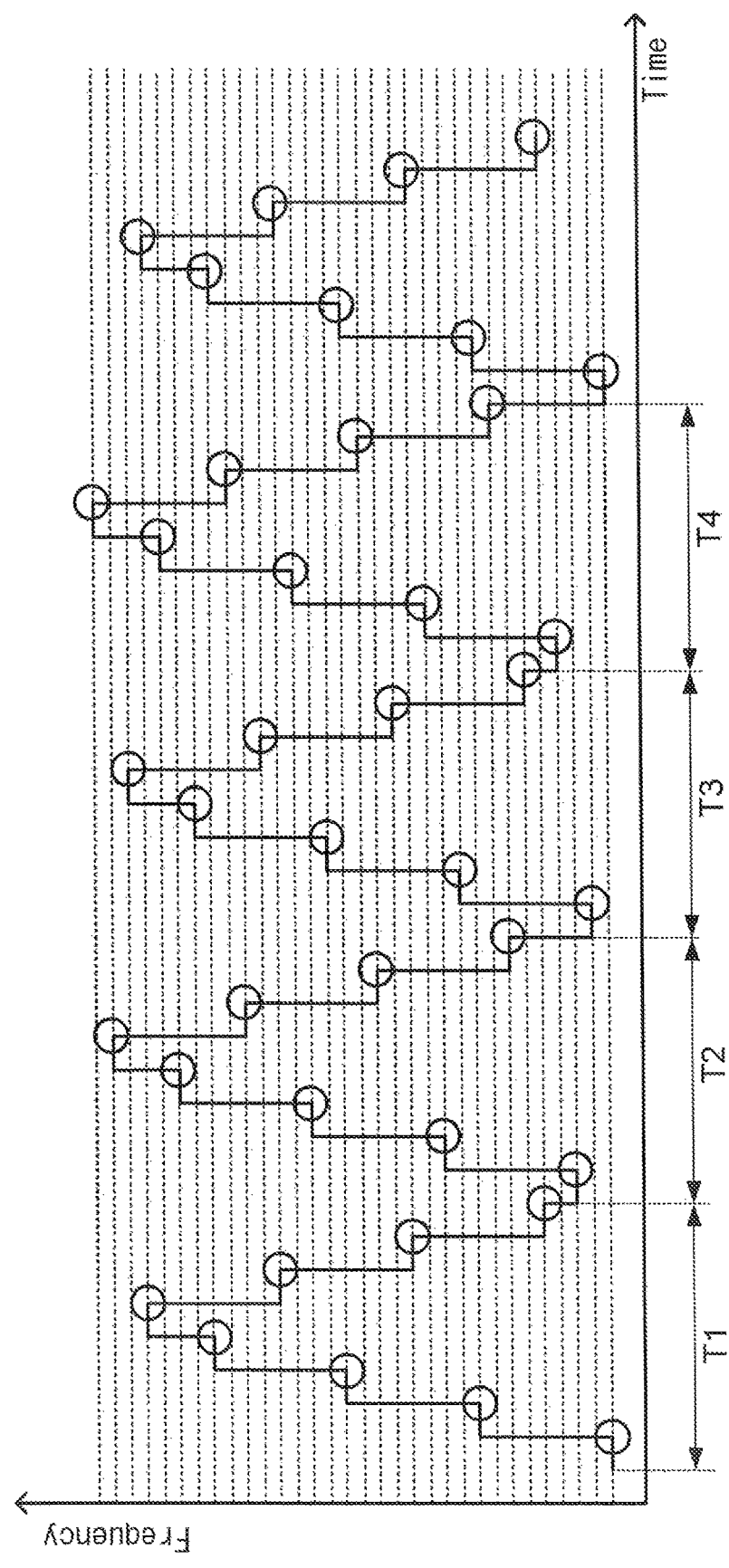
FIG. 10 is a diagram showing a temporal transition of a clock signal frequency according to the third embodiment of the present invention.

The DAC 41 performs D/A conversion of the digital input constituted of bit0 to bit4 so as to output the reference voltage RTREF, and the frequency of the clock signal CLK is proportional to the reference voltage RTREF. Therefore, temporal transition of the frequency of the clock signal CLK corresponding to count by the counter 21 is as shown in FIG. 10. FIG. 10 shows a case where the frequency of the clock signal CLK is synchronized with the frequency spreading periods T1 to T4.

In FIG. 10, each of the periods T1 to T4 is a period corresponding to each of the first to fourth counts. In this way, in each of the periods T2 to T4, with reference to one period T1, the frequency of the clock signal CLK has a different offset while maintaining the same increase and decrease. In other words, the frequency (oscillation frequency) of the clock signal CLK (oscillation signal) has the increasing and decreasing component that increases and decreases in one period and the offset component for each period.

In FIG. 10, noises having frequencies corresponding to ⅛, 1/16, and 1/32 of the one clock frequency of the clock signal CLK are generated, and a noise having ⅛ frequency among them becomes dominant. Therefore, it is possible to reduce generation of low frequency noise in the audible band.

In addition, broken lines shown in FIG. 10 indicate frequency levels generated in each of the periods T1 to T4. In this way, in this embodiment, also in the case where the frequency of the clock signal CLK is synchronized with the frequency spreading periods T1 to T4, in the period constituted of each of the periods T1 to T4, the frequency is spread into 32 frequencies. In the asynchronized case, the frequency is spread into more number of frequencies. Therefore, sufficient frequency spreading can reduce a noise peak.

In this way, in this embodiment, the effect of frequency spreading can be improved while reducing low frequency noise in the audible band.

Fourth Embodiment

Next, a fourth embodiment as a variation of the third embodiment is described. A specific structure of the counter 2, the logic circuit 3, and the DAC 4 according to the fourth embodiment is the structure of FIG. 3 described above, and detailed description of this structure is omitted because it is described above.

In this structure shown in FIG. 3, transitions of output bits in the first counter 22 and the second counter 50 and input bits in the DAC 42 in a case where the first counter 22 counts are as shown in FIG. 5 as described above.

Figure 11:
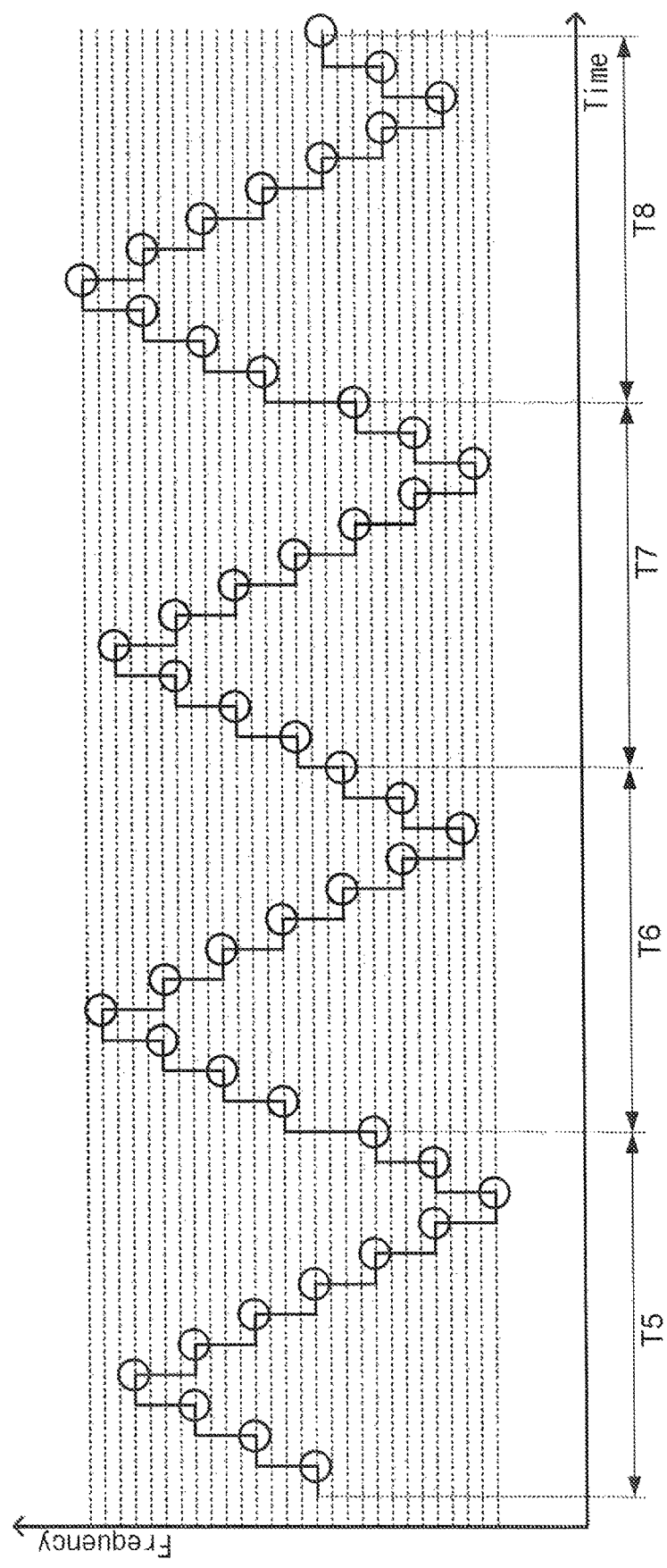
FIG. 11 is a diagram showing a temporal transition of a clock signal frequency according to the fourth embodiment of the present invention.
Figure 12:
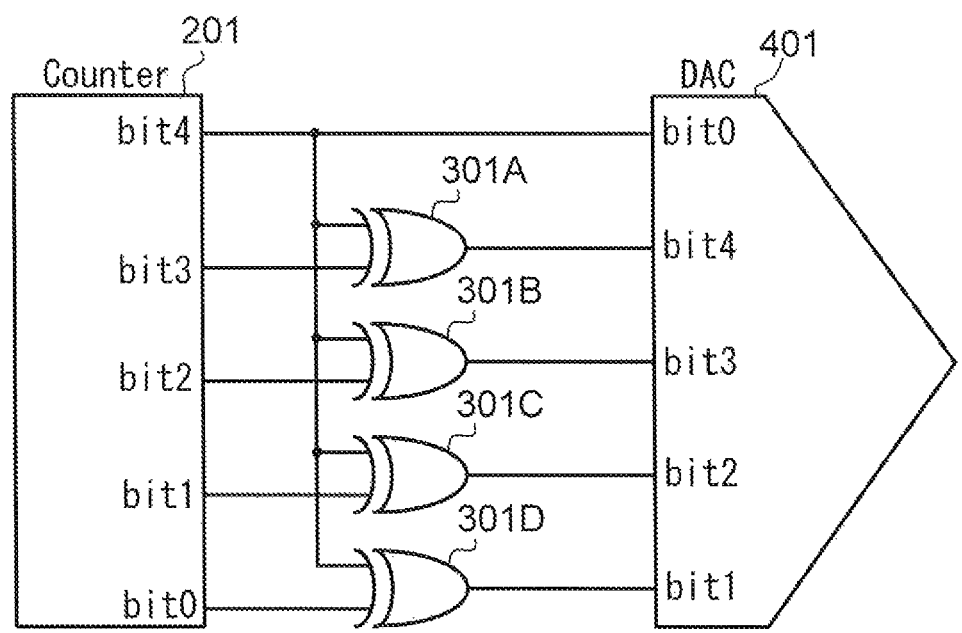
FIG. 12 is a diagram showing a structure using a counter and a DAC according to a first comparison example of the present invention.
Figure 13:
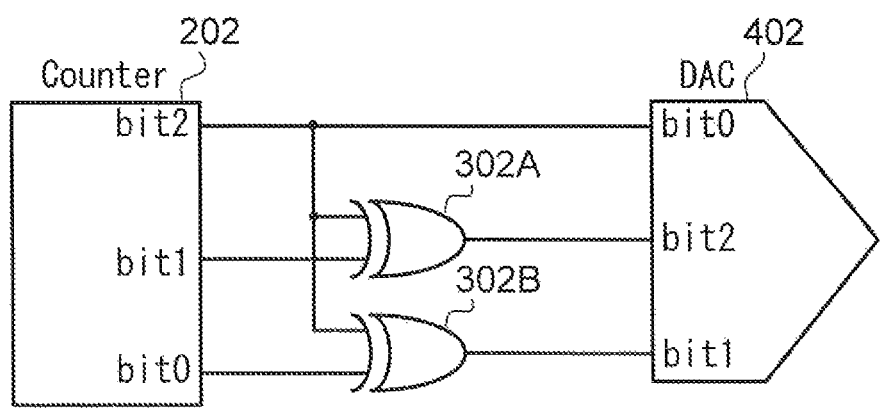
FIG. 13 is a diagram showing a structure using a counter and a DAC according to a second comparison example of the present invention.
Figure 14:
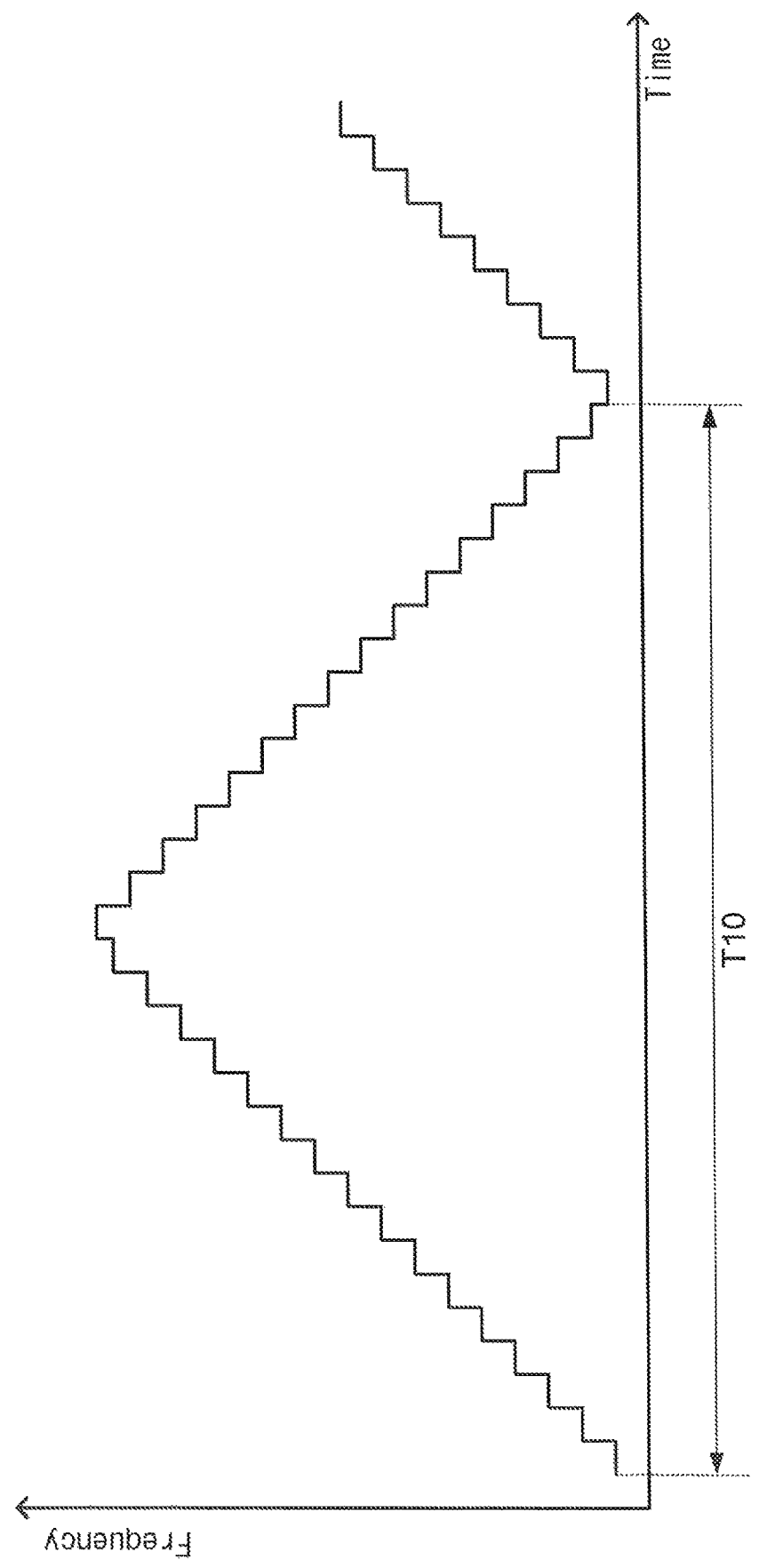
FIG. 14 is a diagram showing a temporal transition of a clock signal frequency according to the first comparison example of the present invention.
Figure 15:
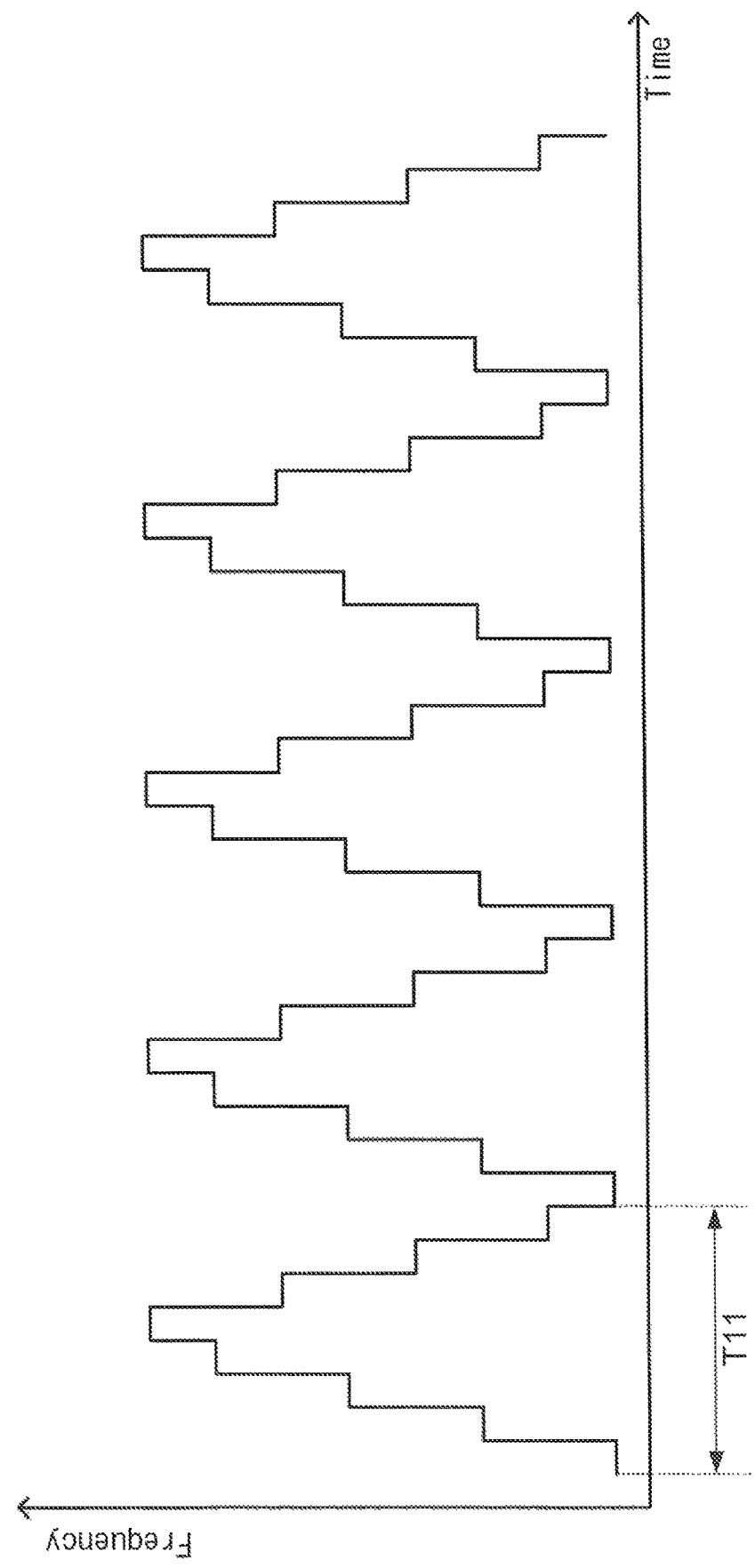
FIG. 15 is a diagram showing a temporal transition of a clock signal frequency according to the second comparison example of the present invention.
Figure 16:
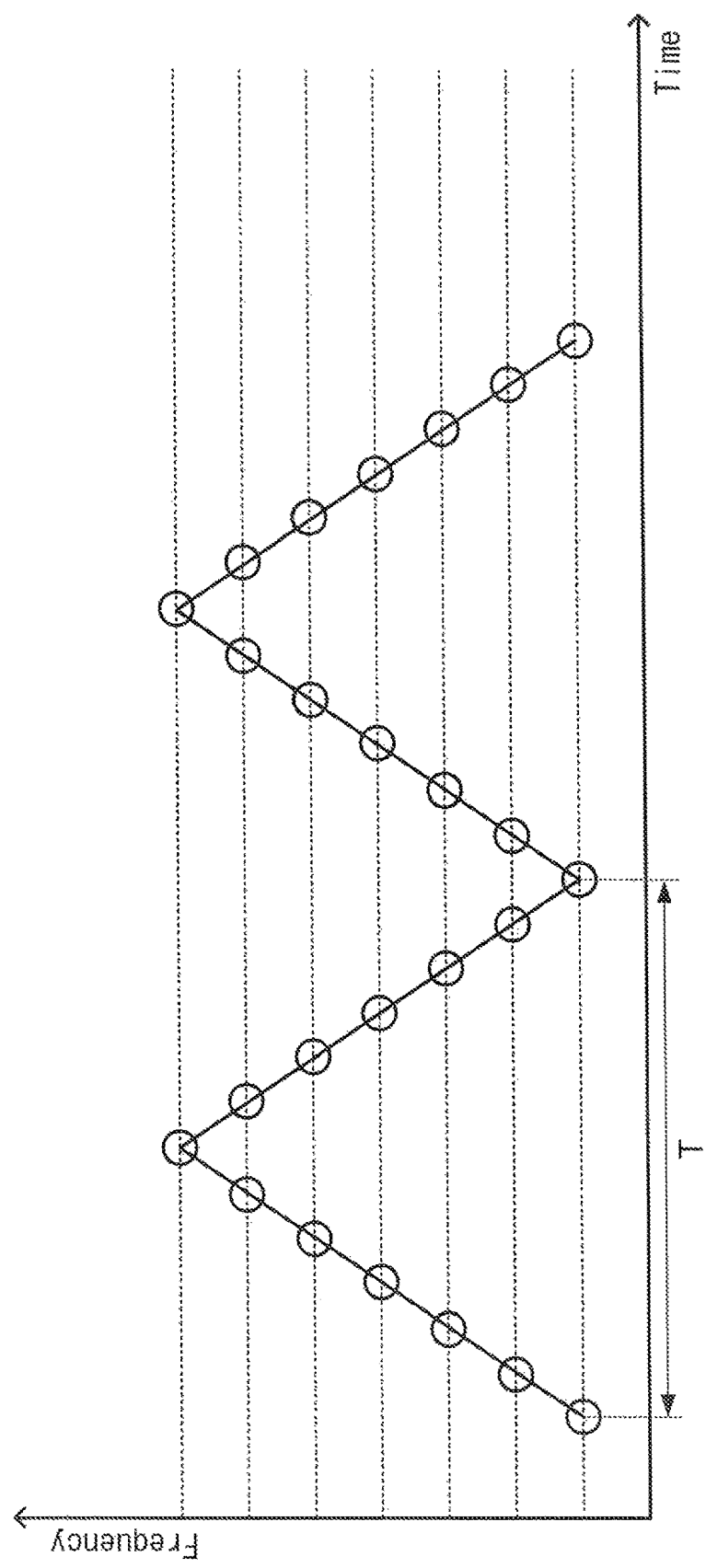
FIG. 16 is a diagram showing one example of a temporal transition of the clock signal frequency in a case where the reference voltage generation portion is constituted of an analog circuit.
Figure 17:
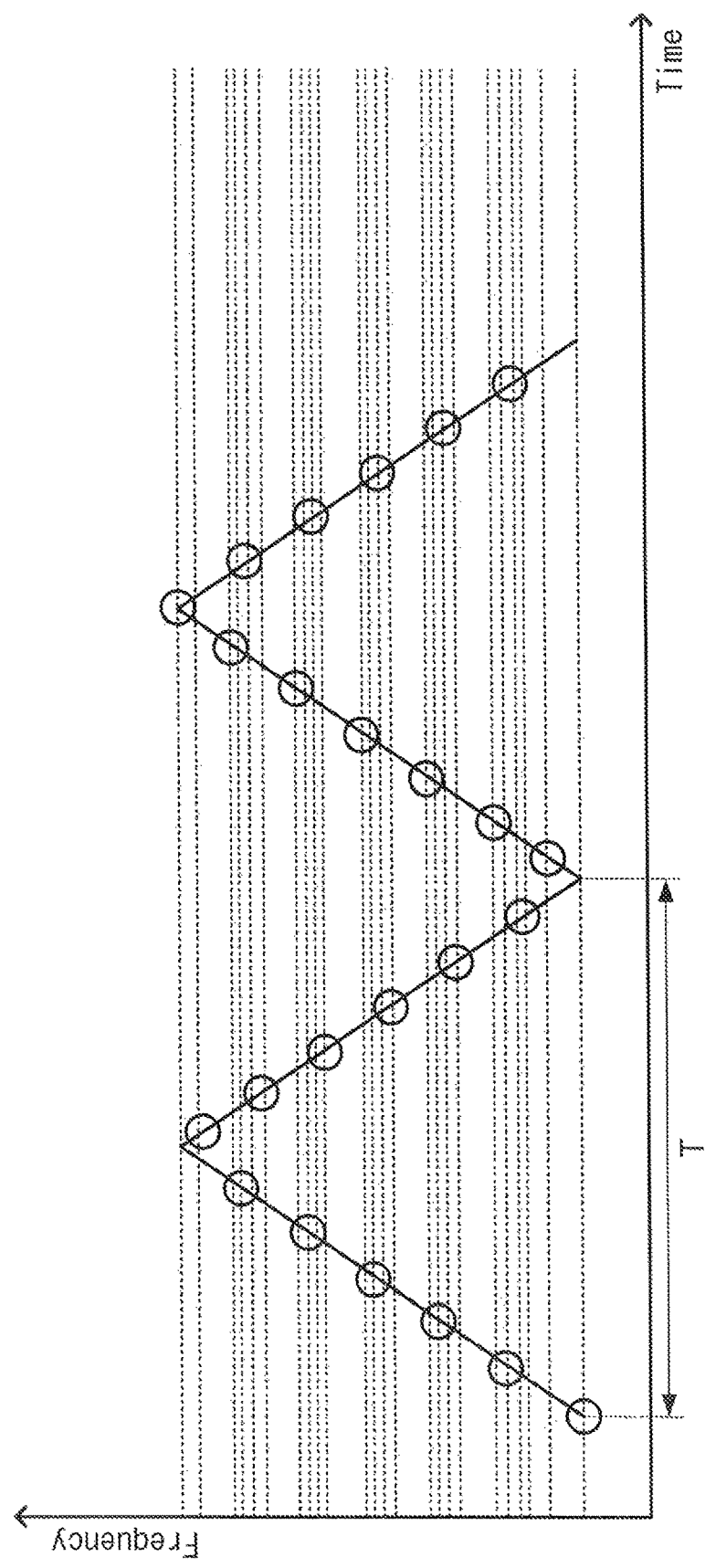
FIG. 17 is a diagram showing another example of a temporal transition of the clock signal frequency in a case where the reference voltage generation portion is constituted of an analog circuit.
Figure 18:
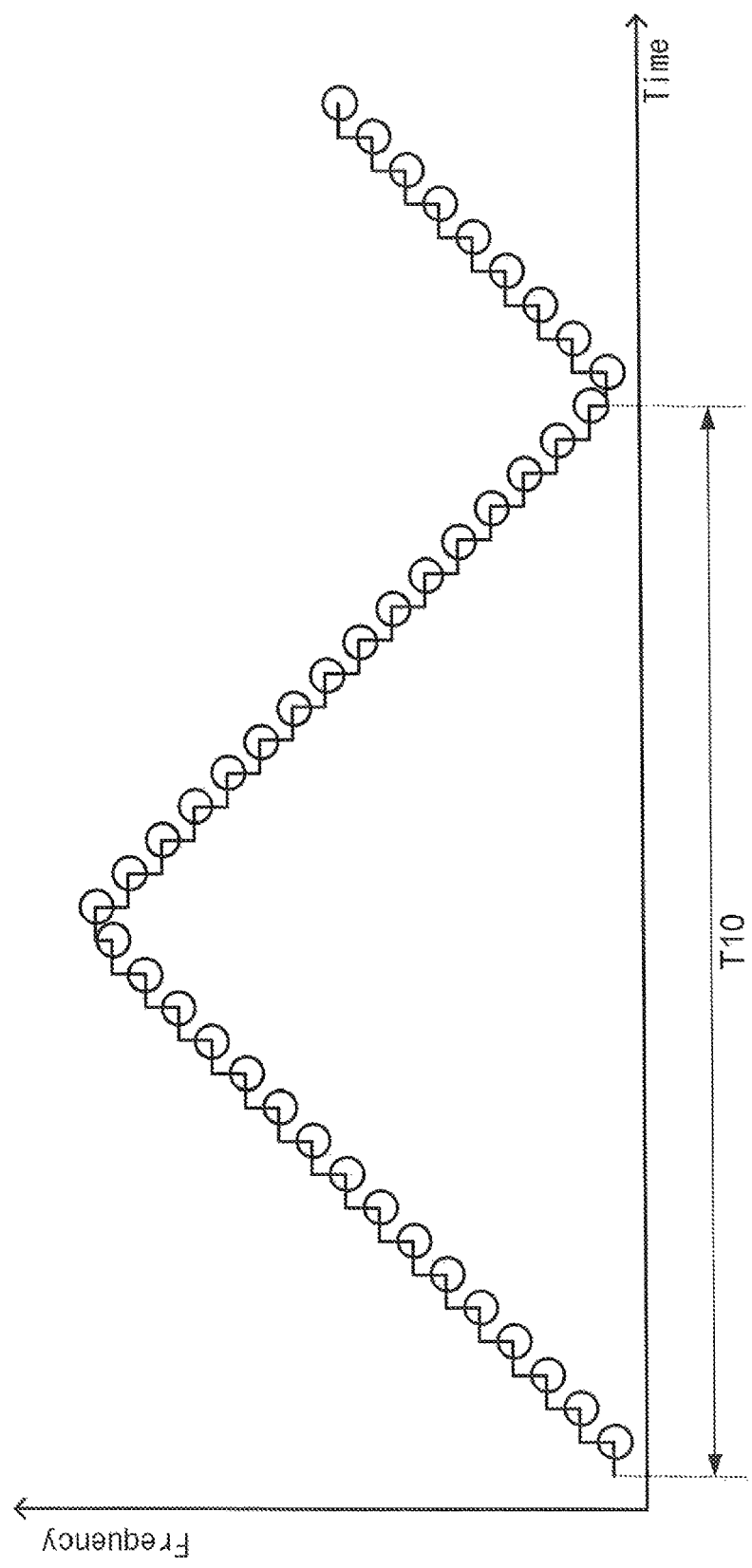
FIG. 18 is a diagram showing a temporal transition of the clock signal frequency according to the first comparison example of the present invention.
Figure 19:
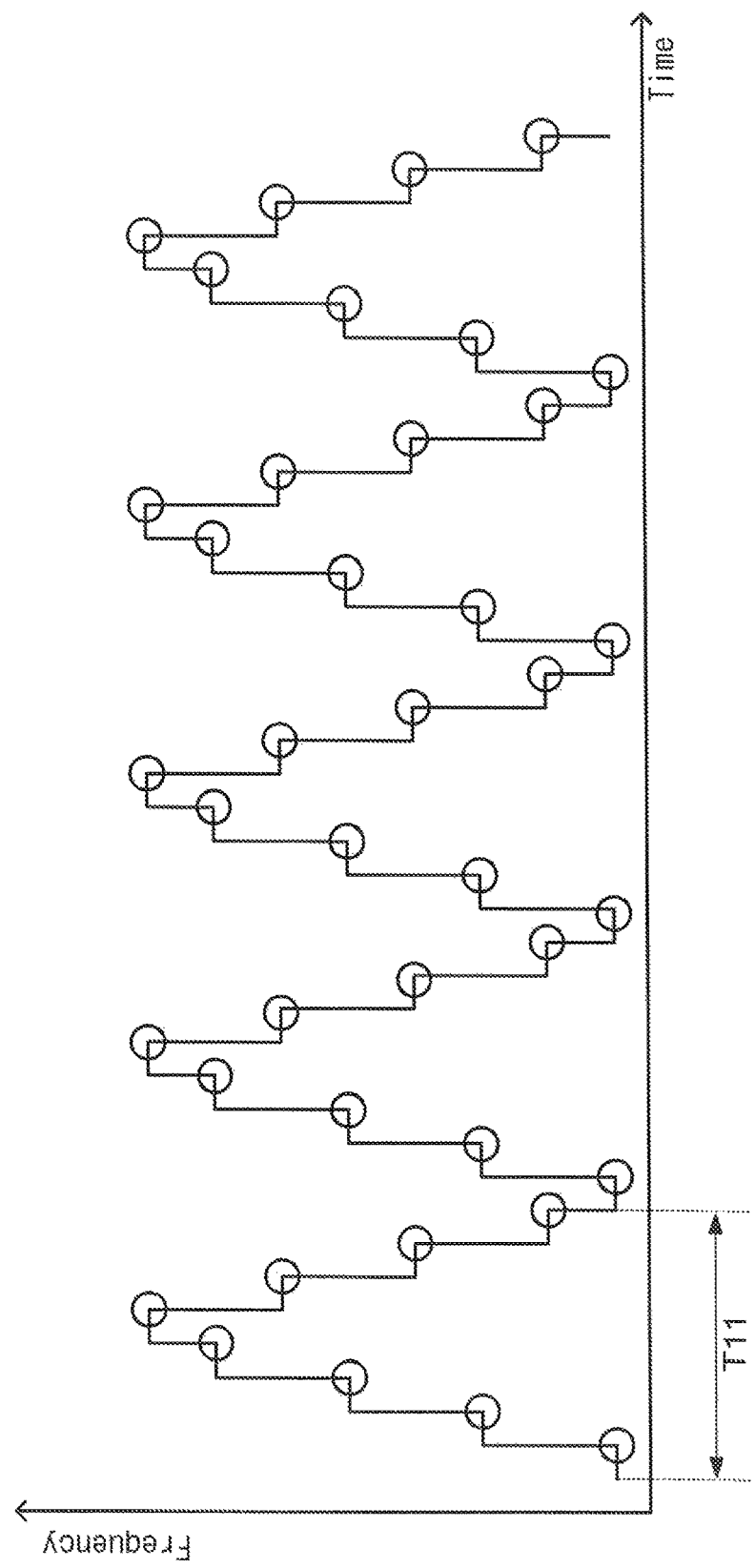
FIG. 19 is a diagram showing a temporal transition of the clock signal frequency according to the second comparison example the present invention.

The temporal transition of the frequency of the clock signal CLK corresponding to count by the counter 22 is as shown in FIG. 11. FIG. 11 shows a case where the frequency of the clock signal CLK is synchronized with the frequency spreading periods T5 to T8.

In FIG. 11, each of periods T5 to T8 is a period corresponding to each of the first to fourth counts. In this way, in each of periods T6 to T8, with reference to one period T5, the frequency of the clock signal CLK has an offset while maintaining the same increase and decrease. In other words, the frequency (oscillation frequency) of the clock signal CLK (oscillation signal) has the increasing and decreasing component that increases and decreases in one period and the offset component for each period.

In FIG. 11, a noise having a frequency corresponding to 1/12 of the one clock frequency of the clock signal CLK becomes dominant, and hence it is possible to reduce generation of low frequency noise in the audible band.

In addition, broken lines shown in FIG. 11 indicate frequency levels generated in each of the periods T5 to T8. In this way, in this embodiment, also in the case where the frequency of the clock signal CLK is synchronized with the frequency spreading periods T5 to T8, in the period constituted of each of the periods T5 to T8, the frequency is spread into 28 frequencies. In the asynchronized case, the frequency is spread into more number of frequencies. Therefore, sufficient frequency spreading can reduce a noise peak.

In this way, also in this embodiment, the effect of frequency spreading can be improved while reducing low frequency noise in the audible band.

<Other Variations>

The embodiments of the present invention are described above, and the embodiments can be variously modified within the scope of the spirit of the present invention.

For example, the XOR circuits 31A and 31B are disposed in the structure of FIG. 2 described above, but bit2, bit1, and bit0 in the counter 21 may be directly connected to bit2, bit4, and bit3 in the input of the DAC 41, respectively, without disposing the XOR circuits. In this way, the upper three bits in the input of the DAC 41, which indicate the increasing and decreasing component, increase from "000" to "110" and then decrease to "001", and increase again to "111". In this way too, the object of the present invention can be achieved.

In addition, in the structure of FIG. 2 described above, the lower two bits in the input of the DAC 41, which indicate the offset component, may be connected to the upper two bits in the output of the counter 21 without reversing the upper and lower relationship.

In addition, in the structure of FIG. 3 described above, the upper three bits in the DAC 42, which indicate the increasing and decreasing component, may be connected to the output bits in the first counter 22 via inverters, respectively. In this way, the upper three bits in the DAC 42 have a value that decreases and then increases, and decreases again, and the object of the present invention is achieved. The inverters described above constitute the logic circuit 3.

What is claimed is:

1. An oscillator arranged to output an oscillation signal of an oscillation frequency having an increasing and decreasing component that increases and decreases in one period and an offset component for each period, the oscillator comprising:
    an oscillation circuit arranged to output the oscillation signal;
    a counter arranged to count the oscillation signal output from the oscillation circuit; and
    a DAC (D/A converter) having an input connected to an output of the counter, wherein
    the oscillation circuit generates the oscillation signal based on an output of the DAC,
    an input of the DAC has first bits indicating the increasing and decreasing component and second bits indicating the offset component, and the first bits are connected to the output of the counter via a logic circuit and/or directly.

2. The oscillator according to claim 1, wherein
the output of the counter and the input of the DAC are constituted of N bits each,
lower K bits in the output of the counter are connected to upper K bits in the input of the DAC,
(N−K) bits other than the lower K bits in the output of the counter are connected to (N−K) bits other than the upper K bits in the input of the DAC,
the upper K bits in the input of the DAC are the first bits, and
the (N−K) bits in the input of the DAC are the second bits.

3. The oscillator according to claim 2, wherein
a most significant bit in the lower K bits in the output of the counter is connected to a least significant bit in the upper K bits in the input of the DAC and is connected to one of input terminals of an XOR circuit, and
bits other than the most significant bit in the lower K bits in the output of the counter are connected to bits other than the least significant bit in the upper K bits in the input of the DAC via the XOR circuit.

4. The oscillator according to claim 2, wherein the (N−K) bits in the output of the counter are connected to the (N−K) bits in the input of the DAC by reversing an upper and lower relationship.

5. The oscillator according to claim 1, further comprising another counter different form the counter, wherein
the output of the counter is constituted of K bits,
the input of the DAC is constituted of N bits,
an output of the another counter is constituted of (N−K) bits,
the counter performs counting up and counting down,
the output of the counter is connected to upper K bits in the DAC,
the another counter counts edges of the most significant bit in the output of the counter,
the output of the another counter is connected to bits other than the upper K bits in the input of the DAC,
the upper K bits in the input of the DAC are the first bits, and
the bits other than the upper K bits in the input of the DAC are the second bits.

6. The oscillator according to claim 5, wherein the output of the counter is directly connected to the upper K bits in the DAC.

7. The oscillator according to claim 5, wherein the output of the another counter is connected to the bits other than the upper K bits in the input of the DAC by reversing an upper and lower relationship.

8. An oscillator arranged to output an oscillation signal of an oscillation frequency having an increasing and decreasing component that increases and decreases in one period and an offset component for each period, the oscillator comprising:
an oscillation circuit arranged to output a first oscillation signal;
an oscillation portion arranged to output a second oscillation signal;
a counter arranged to count the second oscillation signal; and
a DAC (D/A converter) having an input connected to an output of the counter, wherein
the oscillation circuit generates the first oscillation signal based on an output of the DAC,
an input of the DAC has first bits indicating the increasing and decreasing component and second bits indicating the offset component, and
the first bits are connected to the output of the counter via a logic circuit and/or directly.

9. The oscillator according to claim 8, wherein
the output of the counter and the input of the DAC are constituted of N bits each,
lower K bits in the output of the counter are connected to upper K bits in the input of the DAC,
(N−K) bits other than the lower K bits in the output of the counter are connected to (N−K) bits other than the upper K bits in the input of the DAC,
the upper K bits in the input of the DAC are the first bits, and
the (N−K) bits in the input of the DAC are the second bits.

10. The oscillator according to claim 9, wherein
a most significant bit in the lower K bits in the output of the counter is connected to a least significant bit in the upper K bits in the input of the DAC and is connected to one of input terminals of the XOR circuit, and
bits other than the most significant bit in the lower K bits in the output of the counter are connected to bits other than the least significant bit in the upper K bits in the input of the DAC via the XOR circuit.

11. The oscillator according to claim 9, wherein the (N−K) bits in the output of the counter are connected to the (N−K) bits in the input of the DAC by reversing an upper and lower relationship.

12. The oscillator according to claim 8, further comprising another counter different form the counter, wherein
the output of the counter is constituted of K bits,
the input of the DAC is constituted of N bits,
an output of the another counter is constituted of (N−K) bits,
the counter performs counting up and counting down,
the output of the counter is connected to upper K bits in the DAC,
the another counter counts edges of the most significant bit in the output of the counter,
the output of the another counter is connected to bits other than the upper K bits in the input of the DAC,
the upper K bits in the input of the DAC are the first bits, and
the bits other than the upper K bits in the input of the DAC are the second bits.

13. The oscillator according to claim 12, wherein the output of the counter is directly connected to the upper K bits in the DAC.

14. The oscillator according to claim 12, wherein the output of the another counter is connected to the bits other than the upper K bits in the input of the DAC by reversing an upper and lower relationship.

* * * * *